United States Patent [19]

Hinata et al.

[11] Patent Number: 4,947,401
[45] Date of Patent: Aug. 7, 1990

[54] SEMICONDUCTOR LASER ARRAY

[75] Inventors: Susumu Hinata; Yoshito Seiwa, both of Itami, Japan

[73] Assignee: Mitsubishi Denki Kabushiki Kaisha, Tokyo, Japan

[21] Appl. No.: 304,170

[22] Filed: Jan. 31, 1989

[30] Foreign Application Priority Data

Feb. 1, 1988 [JP] Japan .................................. 63-21622

[51] Int. Cl.$^5$ ................................................ H01S 3/19
[52] U.S. Cl. .......................................... 372/50; 372/45; 372/46
[58] Field of Search ........................ 372/50, 44, 45, 46, 372/48

[56] References Cited

U.S. PATENT DOCUMENTS 4,594,719  6/1986  Ackley .................................. 372/50
4,719,630  1/1988  Streifer .................................. 372/50
4,831,629  5/1989  Paoli et al. ........................... 372/50

OTHER PUBLICATIONS

"Chirped Arrays of Diode Lasers for Supermode Control", by Kapon et al. Appl. Phys. Lett. 45(3), Aug. 1, 1984, pp. 200–202.

"Triple-Stripe Phase-Locked Diode Lasers Emitting 100 mW CW With Single-Lobed Far-Field Patterns", by Ohsawa et al., Electronics Letters, Aug. 29, 1985, vol. 21, No. 18, pp. 779–780.

"High Power CW Operation Over 400 mW on Five-Stripe Phase-Locked Laser Arrays Assembled by New Junction Down Mounting", by Seiwa et al., J. Appl. Phys. 61(1), Jan. 1, 1987, pp. 440–443.

Primary Examiner—James W. Davie
Attorney, Agent, or Firm—Leydig, Voit & Mayer

[57] ABSTRACT

A semiconductor laser array including multiple semiconductor layers serially disposed on each other to form a plurality of laser stripes that are laterally disposed within the layers each of the lasers stripes including a waveguide of a particular width wherein each of the waveguides has either a relatively wide width or a relatively narrow width and the stripes are laterally arranged with alternatingly wide and narrow waveguides.

19 Claims, 6 Drawing Sheets

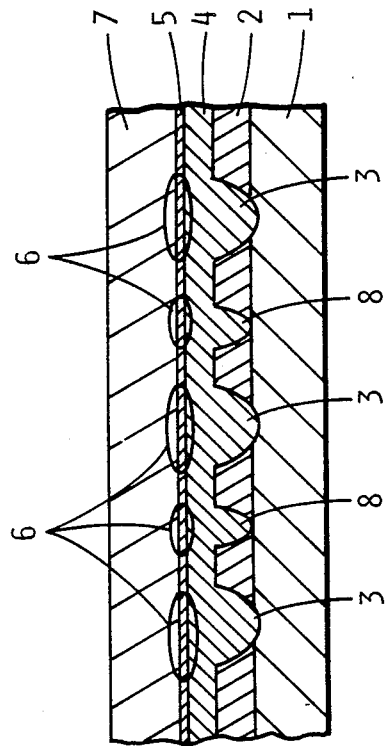
FIG. 1(a)
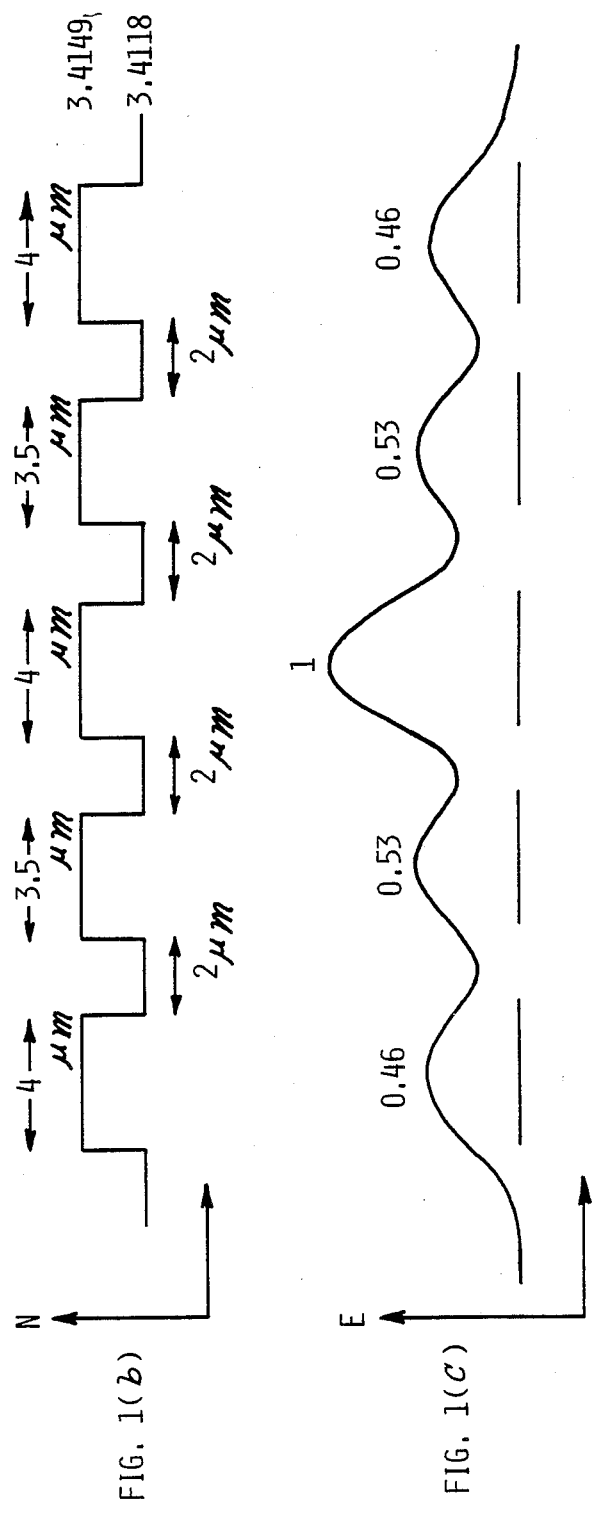
FIG. 1(b)
FIG. 1(c)

SEMICONDUCTOR LASER ARRAY

FIELD OF THE INVENTION

The present invention relates to arrays of semiconductor lasers, and more particularly to supermode operation of laser arrays.

BACKGROUND OF THE INVENTION

Laser arrays having a plurality of parallel laser stripes arranged in a single semiconductor so that each stripes acts as a waveguide and the parallel stripes interact for phase locked operation are known. Such arrays usually excite a plurality of supermodes including the fundamental supermode and higher order supermodes. Each supermode has its own distinctive field pattern, and whichever supermode is predominant will have a major effect on the pattern of light emitted by the laser array.

In greater detail, FIG. 2(a) shows a crosssectional view of a prior art semiconductor laser array including five laser stripes laterally spaced from each other in the same serially disposed semiconductor layers. In a laser array like that of FIG. 2(a), the spacing of the stripes and the materials between the stripe grooves establish phase relationships between the radiative oscillations produced by each of the laser stripe. Those phase relationships determine the oscillation modes of the array and its radiation pattern. Because several different phase interactions may occur between the different laser stripes in an array, laser arrays may support more than one oscillation mode, usually called a supermode. Generally, only one of the several possible supermodes is excited when a laser array is operated. That excited supermode generally exhibits the lowest threshold current for laser oscillation, i.e., the highest modal gain of the available supermodes. It is desirable to discriminate among the supermodes and to suppress unwanted supermodes to achieve optimal phase coherence in the radiation produced. Oscillation in the fundamental supermode desirably produces a single-lobed beam directed parallel to the laser waveguides. Higher order supermodes may produce two-lobe far-field radiative patterns. The favored supermode depends upon the lateral gain distribution across the array.

The structure and operation of a known semiconductor laser array employing five uniformly spaced laser stripes is explained with reference to FIG. 2(a). The array includes a substrate 1 which may be p-type GaAs. An oppositely doped, discontinuous current blocking layer 2, such as n-type GaAs, is disposed on substrate 1, preferably being deposited by an epitaxial growth process. In the array of FIG. 2(a), five stripe grooves 3 have been formed by chemically etching through layer 2 and into substrate 1 at five separate locations using a conventional photolithography technique. The etching divides formerly continuous layer 2 into four spaced apart mesas between and defining the grooves 3. Grooves 3 are uniformly spaced with a separation d of about two microns and each groove has a width w of about three microns.

A first cladding layer 4 is disposed in and over grooves 3 and over the mesas and islands of layer 2. Cladding layer 4, in the example described, is p-type AlGaAs. An active layer 5 is disposed on cladding layer 4. In the example being described, active layer 5 is p-type AlGaAs. A second cladding layer 7, in the example n-type AlGaAs, disposed on active layer 5. Layers 4, 5, and 7 are all produced by epitaxial growth, preferably liquid phase epitaxy, although other techniques such as metal organic chemical vapor deposition or molecular beam epitaxy can be used in appropriate circumstances.

Layer 2 functions as a current blocking layer because of the pn junction formed between it and substrate 1. Because of layer 2, currents flowing transversely through the layers are concentrated in the areas of grooves 3. As a result, only the encircled regions 6 of active layer 5, each of which is disposed opposite a respective groove 3, produces radiative oscillations. As in a conventional semiconductor laser, the light oscillations produced in active regions 6 are transversely confined by cladding layers 4 and 7 and are laterally confined by the relatively lossy regions of layer 2. This waveguide confinement results in the desired laser oscillation and radiative emission.

The structure of FIG. 2(a) produces a refractive index distribution of the type illustrated in FIG. 2(b). The refractive index has one effective value at each groove 3, indicated by width w in FIG. 2(b), and a different, lower value in the region between adjacent grooves, indicated as d in FIG. 2(b). In the example described, the change in refractive index between these two regions, $\Delta n$, is about 0.0031. That refractive index distribution results in an electric field distribution, when the laser array is in operation, as indicated in FIG. 2(c). The electric field distribution has five peaks of relatively uniform amplitude and intervening valleys.

In operation, each of the five laser stripes in the array of FIG. 2(a) operates as a single stripe laser. In addition, if the stripes are spaced sufficiently closely, such as the 2 microns spacing of the example, there is interaction between the stripes of the array. The interactions of the radiative emissions produced at each of grooves 3 can support several supermodes of oscillation. The oscillations generally occur in one or more characteristic modes, i.e., one or more eigenmodes, for the array. The relative gain of the separate modes can be determined by measuring and by analyzing the radiative pattern of the array. Generally, there will be a fundamental supermode and higher order, i.e., harmonic, supermodes so that the total number of supermodes produced equals the number of grooves. In keeping with the usual fundamental and harmonic mode numbering scheme, the fundamental supermode number is assigned the number 1, and higher order supermodes are assigned increasing integers.

The relative gain of the various supermodes for the array of FIG. 2(a) is shown in FIG. 3(a) which is taken from *Applied Physics Letters*, Vol. 55, No. 3, pps. 200–202 (1984). In calculating the relative gains of the various supermodes, it is assumed that the gain distribution is proportional to the square of the electric field intensity distribution of the array.

As shown in FIG. 3(a), as generally experimentally verified, and as further described in the *Applied Physics Letters* article, the highest order supermode of the array of FIG. 2(a) has the highest relative modal gain and is therefore the predominant supermode, i.e., the one that is supported at the lowest threshold current. That mode produces an undesirable two-lobe far-field radiation pattern. A radiation pattern with more than one lobe is difficult or impossible to collimate in a simple optical system. A single-lobe far-field pattern produced by suppressing the higher order supermodes makes the laser array of FIG. 2(a) more useful. By suppressing the gain of the supermodes having numbers two through five so that the fundamental supermode is predominant or the only supermode, a single-lobe farfield radiation pattern may be produced.

The aforementioned *Applied Physics* article is said to introduce the concept of nonuniform laser arrays, in which the channels (or stripes) are made purposely nonidentical to discriminate between the supermodes and allow the suppression of all higher order supermodes. Two so-called chirped arrays are described, and both are said to produce gain distributions in which the fundamental supermode predominants. The nonuniform arrays which are described are termed the linearly chirped array and the "v" chirped array.

In a five laser array having an inverted "v" chirped distribution, the groove widths are symmetrically distributed with the widest groove in the center, adjacent narrower grooves and still narrower outside grooves. The resulting refractive index and electric field distribution for the inverted v chirped groove width distribution are shown in FIGS. 4(a) and 4(b), respectively. That electric field distribution is sharply peaked at the center and has substantially suppressed side lobes, as indicated by the relative amplitudes illustrated in FIG. 4(b). As a result, when the laser is operated there is a concentration of energy at the central peak which establishes a limit at which the laser can be operated; operation beyond that limit can cause localized failure at the part of the array associated with the central peak because of the energy concentration at that peak which is achieved by the nonuniform spacing.

Another chirped groove distribution disposes the narrowest groove at one end of the array with increasing groove widths to the widest groove at the opposite end of the array. The resulting refractive index and electric field distributions (see relative amplitudes illustrated in FIG. 5(b)) for that groove distribution are shown in FIGS. 5(a) and 5(b), respectively. The electric field distribution includes an amplitude peak at the end of the array which has the widest groove. Like the v-chirped array, the linearly chirped array also has a sharp peak in energy distribution which results in the potential for laser failure at the part of the array associated with the energy peak.

It should be noted that the diagrams of FIGS. 4(b) and 5(b) represent electric field intensity plotted against position on the array. Because the energy emitted from the laser depends upon the square of the electric field intensity, the concentration at a local area of the facet is even stronger than indicated by the electric field distributions of FIGS. 4(b) and 5(b). These relatively high concentrations of energy limit the power that can be produced by the laser arrays without exceeding safe operating temperatures at local areas on the radiating facet.

SUMMARY OF THE INVENTION

In view of the foregoing, it is a general aim of the present invention to provide a laser array which reliably operates in the fundamental supermode, but has an energy distribution across the array which is more uniform than has been achieved in the prior art considered above.

In that regard, it is an object of the present invention to provide a phase locked semiconductor laser array which is as easy to fabricate as arrays of the prior art, but which operates at the fundamental supermode to produce a single-lobed far-field radiation pattern and has the capability for enhanced power output.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

A laser array in accordance with the present invention includes a plurality of laser stripes, each having its own optical waveguide in one of two alternating relatively wide and relatively narrow widths. The waveguides are arranged so that the relatively narrow and relatively wide widths alternate, preferably with a central relatively wide waveguide and an odd number of total waveguides. The size and spacing of array pattern introduces a degree of uniformity, i.e., alternates between stripes of wide and narrow width. Such an arrangement constitutes means for not only rendering the modal gain of the fundamental supermode higher than that of the higher order supermodes, but also means for spreading energy in the fundamental supermode substantially across the array to minimize local high energy concentration regions, and thereby allow higher power operation.

Embodiments of the invention may be employed with groove-type, self-aligning structure and ridge-waveguide-type laser stripes in an array. More generally, an array according to the invention includes an active semiconductor layer sandwiched between first and second semiconductor cladding layers of opposite conductivity types, a discontinuous current blocking layer disposed on and of different conductivity type from the first cladding layer, and a semiconductor substrate of the same conductivity type as the first cladding layer disposed under at least part of the first cladding layer and contacting the discontinuous current blocking layer. The discontinuous current blocking layer includes a plurality of alternating relatively widely and relatively narrowly spaced apart portions whereby a plurality of corresponding alternating relatively wide and relatively narrow active portions of the active layer are formed when the laser array is operated.

BRIEF DESCRIPTION OF THE DRAWINGS

FIG. 1(a) is a cross-sectional view of a semiconductor laser array exemplifying a first embodiment of the present invention;

FIGS. 1(b) and 1(c) are diagrams effective refractive index and the electric field distributions, respectively, of the laser array of FIG. 1(a);

DETAILED DESCRIPTION OF THE PREFERRED EMBODIMENTS

Figure 2A:
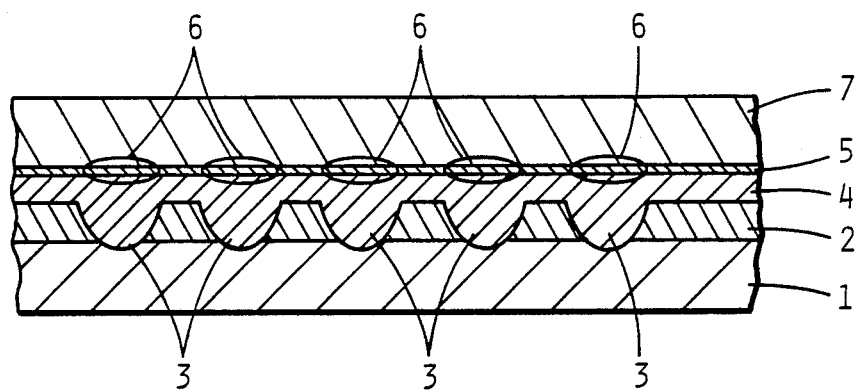
FIG. 2(a) is a cross-sectional view of a prior art semiconductor laser array.
Figure 2B:
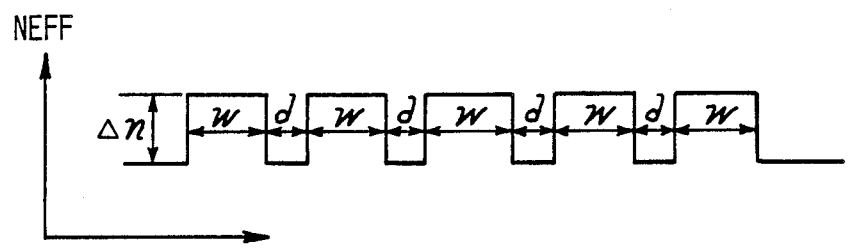
FIG. 2(b) is a diagram of the effective refractive index of the laser array embodiment of FIG. 2(a)
Figure 2C:
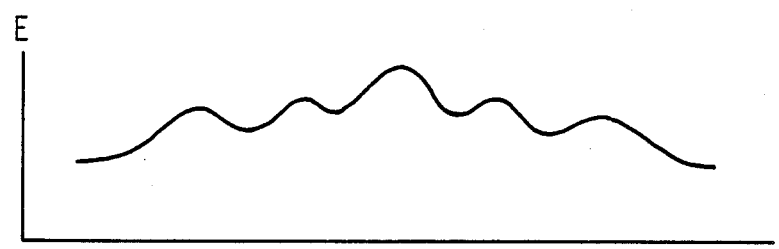

Turning now to the drawings, FIG. 1(a) schematically illustrates a cross-sectional view of a semiconductor laser array according to the invention. While that embodiment and others disclosed below are described with respect to particular materials having particular conductivity types, the invention is not limited to those materials or conductivity types. The laser array of FIG. 1(a) includes a p-type GaAs substrate 1 on which a discontinuous n-type GaAs current blocking layer 2 is disposed. Layer 2 is epitaxially grown on substrate 1 as a continuous crystalline film by a conventional deposition technique, such as liquid phase epitaxy. Thereafter, grooves 3 and 8 are formed in layer 2 (and possibly partially into substrate 1) by conventional photolithography and etching techniques. The formation of grooves 3 and 8 makes current blocking layer 2 discontinuous. Current blocking layer 2 includes four portions that have mesa-like cross-sections, each disposed between one of grooves 3 and one of grooves 8, and two larger islands, one of which is disposed beyond each of the outermost grooves 3.

After the etching of grooves 3 and 8, a first cladding layer 4 is grown in the grooves and on the remaining portions of current blocking layer 2. Preferably, in the specific embodiment being described, cladding layer 4 is p-type AlGaAs. Active semiconductor layer 5, is also preferably of p-type AlGaAs, is subsequently grown on cladding layer 4, and, finally, a second cladding layer 7, preferably of n-type AlGaAs, is grown on active layer 5. Additional contacting layers, not shown in FIG. 1, can be grown on substrate 1 and cladding layer 7 if desired.

In an exemplary embodiment of the invention, the lower cladding layer 4 is p-type $Al_{0.4}Ga_{0.6}As$ in a layer of about 0.4 microns in thickness. The active layer 5 is p-type $Al_{0.1}Ga_{0.9}As$, and the upper cladding layer 7 is of n-type $Al_{0.4}Ga_{0.6}As$. Liquid phase epitaxy is the preferred technique for growing the successive layers.

In operation, an electrical excitation signal is applied across substrate 1 and cladding layer 7. Cladding layers 4 and 7 transversely confine current flow. Current blocking layer 2 laterally confines the flow of electrical current to the regions of grooves 3 and 8. As a result of the current flow confinement, an active region 6 in which laser oscillations occur is formed within active layer 5 opposite each of grooves 3 and 8. In that way, each groove in conjunction with the other layers of the structure defines a waveguide in which laser oscillation takes place.

In accordance with the invention, a laser array is configured in such a way that the fundamental supermode predominates, but a more even energy distribution across the array is achieved, by utilizing laser stripes of two different widths, but introducing a degree of uniformity wherein wide and narrow stripes alternate. As illustrated in FIG. 1(a), grooves 3 have a relatively wide widths and grooves 8 have relatively narrow widths. These laterally disposed grooves and waveguides are alternately arranged, wide-narrow-wide, etc. As shown in FIG. 1(a), it is preferred that a wide groove or waveguide 3 be centrally disposed and that the total number of grooves or waveguides be an odd number.

Figure 4A:
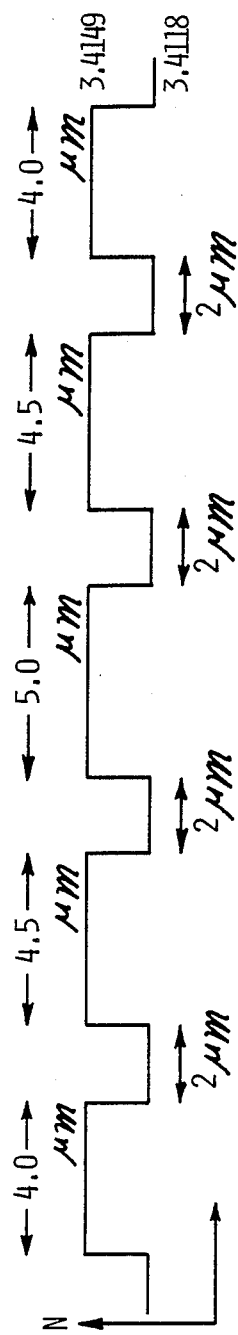
FIGS. 4(a) and 4(b) are diagrams of the effective refractive index and electric field distributions, respectively, of a prior art semiconductor laser array.
Figure 4B:
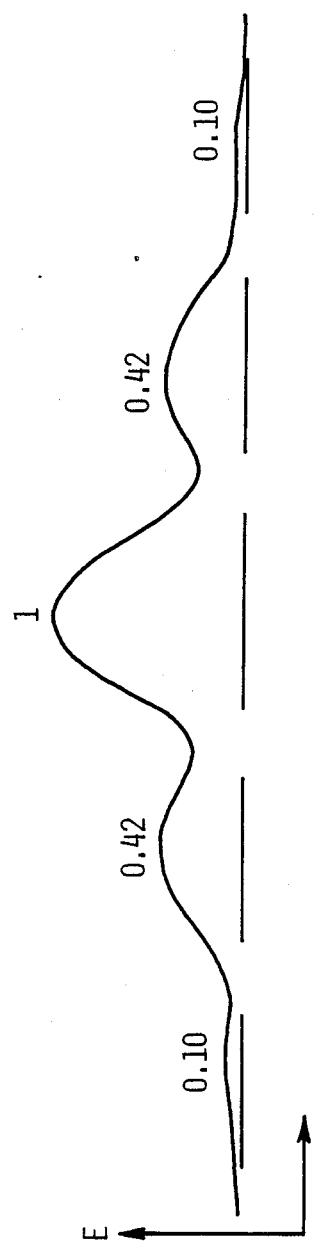
Figure 5A:
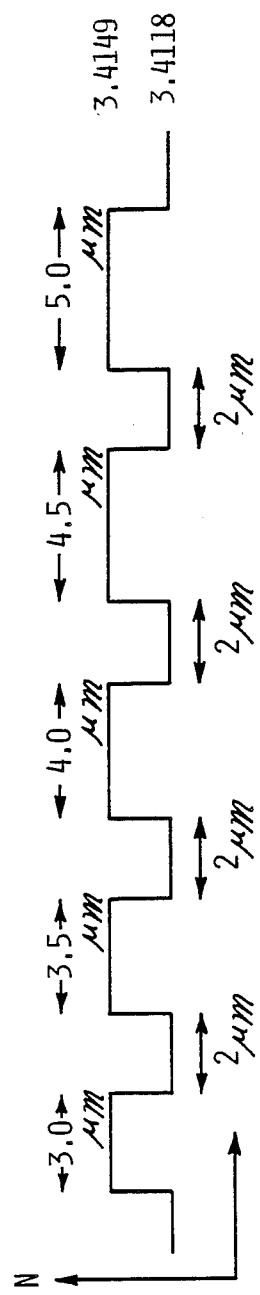
FIGS. 5(a) and 5(b) are diagrams of the effective refractive index and electric field distributions, respectively, of a prior art semiconductor laser array.
Figure 5B:
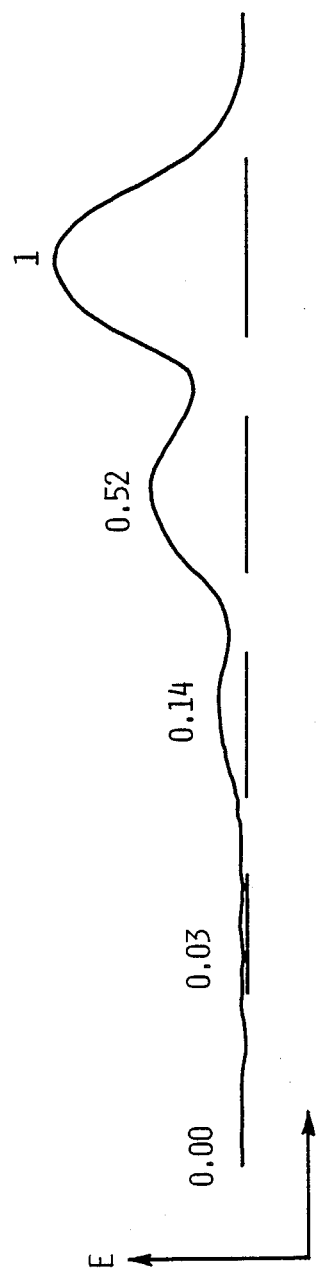

It will now be appreciated that the waveguide sizing and arrangement constitute means for rendering the modal gain of the fundamental supermode higher than that of the higher order supermodes and also for spreading energy in the fundamental supermode substantially across the array. More particularly, FIG. 1(b) illustrates the refractive index distribution of the structure of FIG. 1(a). That distribution results in the electric field distribution shown in FIG. 1(c). The electric field distribution has its maximum at the center groove of the structure and includes relatively strong side lobes at each of the other grooves. In contrast to the electric field distributions of FIGS. 4(b) and 5(b) which each show substantially attenuated side lobes, and only two side lobes of any significance, the distribution of FIG. 1(c) includes four significant side lobes of approximately 0.53 and 0.46 of the main peak. The more uniform electric field intensity of FIG. 1(c), compared to those of FIGS. 4(b) and 5(b), has the advantage of spreading the energy radiated from the array more uniformly across the radiating facet. That more uniform distribution avoids localized energy concentrations or hot spots that limit the total output power of the array.

Figure 3A:
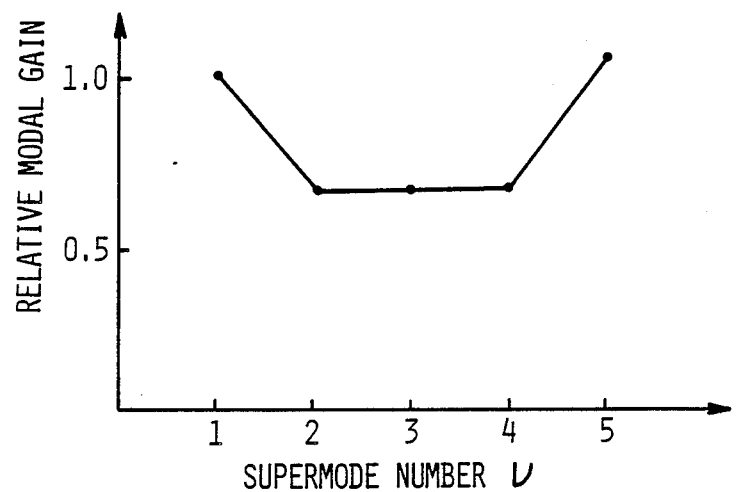
FIGS. 3(a) and 3(b) are diagrams of the relative modal gain of the supermodes produced by the laser arrays of FIGS. 2(a) and 1(a), respectively.
Figure 3B:
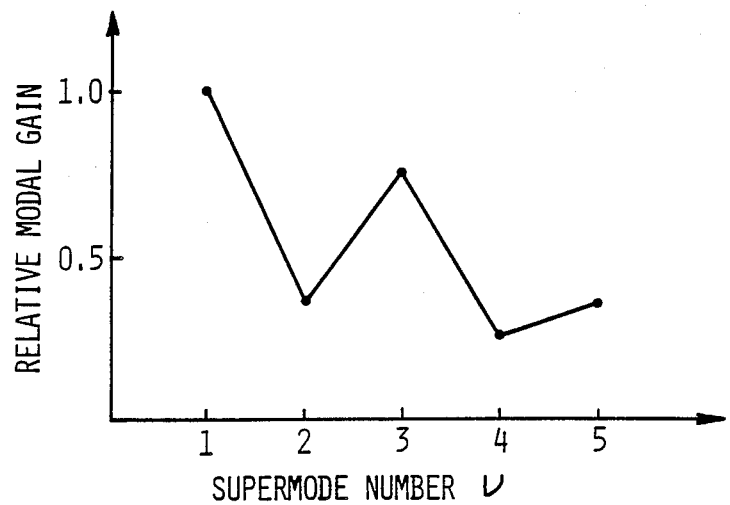

In a specific example of the embodiment of FIG. 1(a), the width $w_1$ of wide grooves 3 is 4 microns and the width $w_2$ of the narrow grooves 8 is 3.5 microns. As in the prior art example described above, the refractive index difference between the groove regions and the interspace regions is 0.0031, the uniform spacing between the grooves is 2 microns, and the wavelength at laser oscillation is 0.81 microns. Because the structure of FIG. 1(a) includes five grooves, five supermodes, one fundamental and four harmonics, will be produced by the laser array. However, because of the distribution of the waveguide sizes taught herein, the relative modal gain of the highest supermode is suppressed relative to that of the fundamental supermode. The relative gain of the fundamental supermode and all four higher supermodes is shown in FIG. 3(b). As indicated there, the highest modal gain occurs for the fundamental supermode, as desired. That result means that the far-field radiation pattern of the laser array will have a single lobe. Thus, the laser array according to the invention suppresses higher order supermodes so that the desired single-lobe far-field radiation pattern is obtained, yet the output power is not localized on the radiating facet so as to limit useful power output or reduce reliability of the array.

The very specific example just described does not limit the invention to specific materials or conductivity types. The laser array of FIG. 1(a) includes five waveguides, i.e., laser stripes. An array according to the invention must include at least three stripes (although at least five is preferred) with the wide-narrow alternation formed by the discontinuous blocking layer. There is no theoretical upper limit on the number of waveguides that can be included.

The relative modal gain $G_v$ of the array as a function of the electric field intensity distribution $\epsilon^2_v(y)$ and the gain distribution g(y), where y is the lateral dimension, is $$G_v = \int_{-\infty}^{\infty} dy g(y) \epsilon_v^2(y) / \int_{-\infty}^{\infty} dy \epsilon_v^2(y)$$

The electric field intensity distribution $\epsilon^2_v(y)$ is determined from Maxwell's equations using the widths of the waveguides, their refractive indices, and the oscillation wavelength. The gain distribution g(y) is assumed to have a distribution similar to that of the fundamental supermode. As can be seen from a comparison of FIG. 1(c) according to the invention and FIGS. 4(b) and 5(b), taking the chirped array of FIG. 5(b) as a standard, the v chirped array of FIG. 4(b) has a maximum light output of about 1.07 times that of the chirped array. However, the laser of the present invention, whose light output is illustrated in FIG. 1(c) has a maximum light output approximately 1.4 times of that of the chirped array of FIG. 5(b).

In FIG. 1(a), emphasis is placed on a laser embodiment employing stripe grooves. However, the invention can also be applied to semiconductor laser arrays employing other waveguide structures. Examples of alternative embodiments of the present invention are shown in cross-sectional views in FIGS. 6 and 7.

Figure 6:
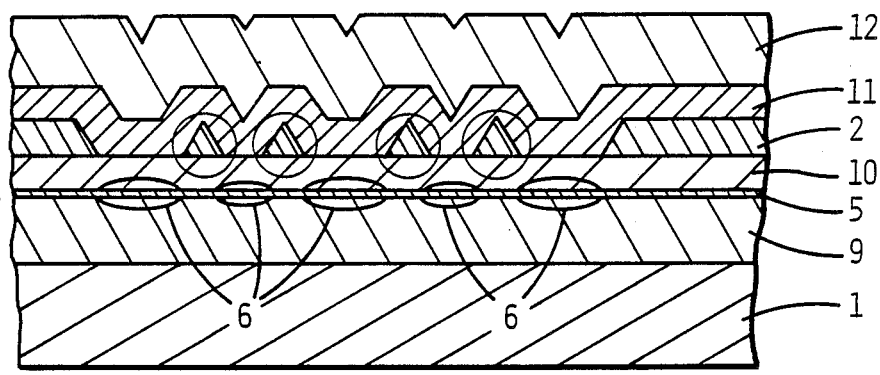
FIG. 6 is a cross-sectional view of another embodiment of a laser array according to the invention.

In FIG. 6, a self-aligning structure is shown in partial schematic cross-section. The laser includes a lower cladding layer 9 of n-type AlGaAs grown on a semiconductor substrate 1. Active layer 5 of AlGaAs is epitaxially grown on the lower cladding layer 9. Thereafter, an upper cladding layer of p-type AlGaAs 10 is epitaxially grown on active layer 5 by a conventional deposition process. An n-type GaAs current blocking layer is grown on cladding layer 10, initially as a continuous film 2. After the deposition of that film, it is masked and etched by conventional methods to produce the discontinuous current blocking layer 2 shown in FIG. 6. As shown in FIG. 6, after the etching step four portions of the current blocking layer 2 that are pyramidal in cross-section are left within the array. Those pyramidal portions are preferably generally uniform in size but are spaced apart laterally by alternating relatively wide and narrow distances. Current blocking layer 2 includes an island at each extreme lateral end of the array. The embodiment of FIG. 6 is an analog of the embodiment of FIG. 1(a) and includes a central relatively wide spacing between adjacent pyramids and a total of five spaces between pyramids and the outer islands of blocking layer 2.

A second upper cladding layer 11, preferably of p-type AlGaAs, is grown on discontinuous current blocking layer 2 and the intervening exposed portions of upper cladding layer 10. Second upper cladding layer 11 generally follows the shape of the pyramidal portions and islands of discontinuous current blocking layer 2. An additional contact layer 12 of p-type GaAs can be disposed on thin second upper cladding layer 11.

The structure of FIG. 6 laterally confines current flowing through the device to the regions at the interface of upper cladding layer 10 and second upper cladding layer 11 where current blocking layer 2 is absent. That confined current flow allows laser oscillations to occur in the encircled active regions 6 of active layer 5. The distribution of these active regions is the same as in the laser array embodiment of FIG. 1(a) and, therefore, the same desirable high fundamental supermodal gain and dispersed energy distribution results are produced.

Figure 7:
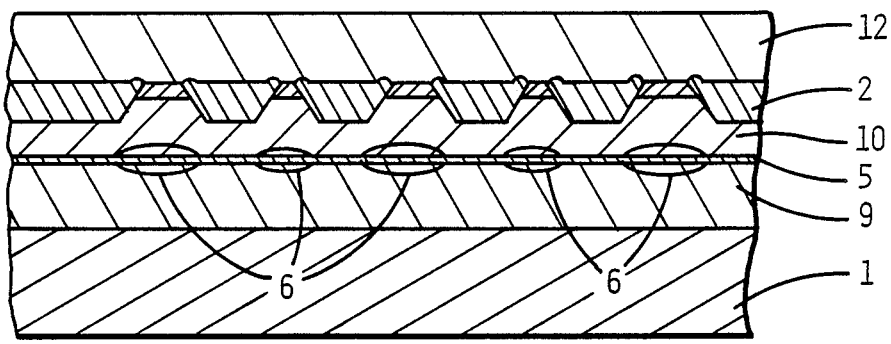
FIG. 7 is a cross-sectional view of still another laser array according to an embodiment of the invention.

In FIG. 7, still another embodiment of the present invention incorporated in a ridge-waveguide type laser structure is illustrated. The initial steps in the construction of the laser array of FIG. 7 are the same as those for FIG. 6 and so are not described again. However, after upper cladding layer 10 of p-type AlGaAs is deposited, a continuous film 13 of p-type GaAs is grown. That layer is masked and etched to open six pockets in which blocking layer 2 is to be grown. The four central pockets have generally trapezoidal cross-sections and are bounded by pockets at the lateral ends of the array that are extended trapezoids. Preferably, the portions of layer 13 that remain after the etching step are masked with silicon nitride to encourage selective epitaxial growth of current blocking layer 2 only in the pockets. After that masking, current blocking layer 2, preferably of n-type GaAs, is grown within the pockets on first cladding layer 10 and in contact with the remaining portions of contacting layer 13. Upon the conclusion of that deposition, the silicon nitride mask on top of the portions of layer 13 is removed, preferably by plasma etching. Thereafter, contact layer 12, preferably of p-type GaAs, is deposited to complete the structure.

In the array of FIG. 7, the grown pockets of discontinuous current blocking layer 2 are of generally uniform size but are mutually spaced apart in an alternating wide-narrow fashion as are the corresponding elements of the embodiments of FIGS. 1(a) and 6. This spacing results in the ridges under layer 13 likewise being laterally arranged in an alternating wide-narrow-wide pattern. That pattern confines current flows to the active regions 6 of active layer 5 so that the desired fundamental supermode, radiation pattern, and energy distribution are attained when the laser array is operated.

Figure 8:
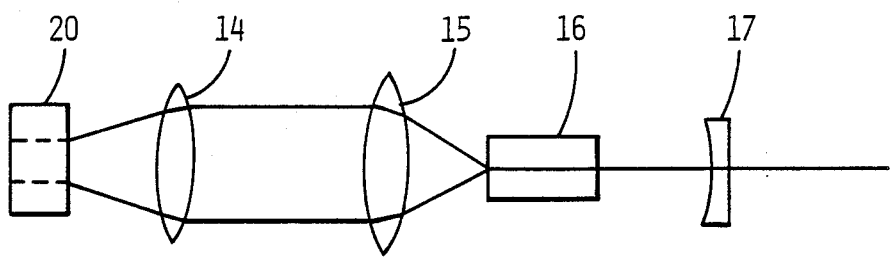
FIG. 8 is a schematic diagram of an apparatus employing a laser array according to the invention as a light excitation source for a solid state laser.

Because the laser array according to the invention can be operated at relatively high output levels without damage from localized hot spots, it can be employed as an excitation source for a solid state laser. Since the far-field radiation pattern of the laser array of the invention has only a single lobe, a simple optical system can be employed in the solid state laser excitation apparatus. An example of such an apparatus is schematically illustrated in FIG. 8. There, a laser array according to the invention is represented by a source 20. The light radiated by that source is collimated by a lens 14 into a generally parallel beam that is focused by a lens 15 onto a solid state laser 16. Laser 16 may employ an Nd:YAG crystal. The light radiated by the solid state laser is partially transmitted by a mirror 17 toward a target (not shown).

What is claimed:

1. In a semiconductor laser array the combination comprising, an active semiconductor layer sandwiched between first and second semiconductor cladding layers, said first cladding layer being of a first conductivity type and said second cladding layer being of a second conductivity type different from said first conductivity type, discontinuous semiconductor current blocking layer means associated with said cladding layers for defining individual laser stripes in the active layer, and a semiconductor substrate of said first conductivity type disposed under at least part of said first cladding layer and contacting said current blocking layer, said discontinuous current blocking layer means including a plurality of portions alternating relatively widely and narrowly spaced apart to form a plurality of corresponding alternatily relatively wide and relatively narrow active portions of said active layer.

2. The combination of claim 1 wherein the total number of said plurality of alternately relatively wide and relatively narrow active portions is an odd number and there are more relatively wide portions than relatively narrow portions.

3. The combination of claim 2 wherein the total number of said plurality of alternately relatively wide and relatively narrow active portions is at least 5.

4. The combination of claim 3 wherein said discontinuous current blocking layer includes a plurality of portions of substantially uniform size, thereby to uniformly space said wide and narrow active portions.

5. The combination of claim 1 wherein said discontinuous current blocking layer includes a plurality of mesa-shaped portions alternately spaced widely and narrowly apart, and said first cladding layer is disposed on and between said mesa-shaped portions touching said contacting layer.

6. The combination of claim 1 wherein said discontinuous current blocking layer includes a plurality of pyramidal-shaped portions, and said contacting layer is disposed on and between said pyramidal-shaped portions touching said first cladding layer.

7. The combination of claim 1 wherein said discontinuous current blocking layer includes a plurality of generally trapezoidal-shaped portions, and said first cladding layer is disposed on and between said trapezoidal-shaped portions touching said contacting layer.

8. The combination of claim 7 wherein said contacting layer is disposed between and touching said trapezoidal portions.

9. The combination of claim 1 wherein said first cladding layer is p-type.

10. The combination of claim 1 wherein said active layer is chosen from one of GaAs and AlGaAs.

11. In a semiconductor laser array the combination comprising, multiple semiconductor layers defining a plurality of parallel laser stripes, the laser stripes defining individual waveguide means spaced sufficiently closely for interacting to produce a fundamental supermode and higher order supermodes, the waveguides being of two widths including a first relatively wide width and a second narrower width, the waveguides being arranged with alternating wide and narrow widths constituting means for rendering the modal gain of the first supermode higher than that of the higher order supermodes, and spreading energy in the first supermode substantially across the array.

12. The combination of claim 11 wherein the total number of waveguides is an odd number and there are more relatively wide waveguides than relatively narrow waveguides.

13. The combination of claim 12 wherein the total number of waveguides is at least 5.

14. The combination of claim 11 wherein said waveguides are generally uniformly spaced apart.

15. The combination of claim 11 wherein said multiple layers include a discontinuous current blocking layer having a plurality of spaced apart portions and said waveguides are defined at least partially by said portions.

16. The combination of claim 15 wherein said portions are mesa-shaped.

17. The combination of claim 15 wherein said portions are pyramidal-shaped.

18. The combination of claim 15 wherein said portions are generally trapezoidal-shaped.

19. The combination of claim 11 wherein said waveguides include one of GaAs and AlGaAs.

* * * * *